United States Patent
Voss et al.

(10) Patent No.: US 10,992,105 B2
(45) Date of Patent: Apr. 27, 2021

(54) STRAIN CONTROL IN OPTOELECTRONIC DEVICES

(71) Applicant: Lawrence Livermore National Security, LLC, Livermore, CA (US)

(72) Inventors: Lars F. Voss, Livermore, CA (US); Paul O. Leisher, Dublin, CA (US)

(73) Assignee: LAWRENCE LIVERMORE NATIONAL SECURITY, LLC, Livermore, CA (US)

( * ) Notice: Subject to any disclaimer, the term of this patent is extended or adjusted under 35 U.S.C. 154(b) by 0 days.

(21) Appl. No.: 16/434,236

(22) Filed: Jun. 7, 2019

(65) Prior Publication Data

US 2019/0386462 A1    Dec. 19, 2019

Related U.S. Application Data

(60) Provisional application No. 62/684,720, filed on Jun. 13, 2018.

(51) Int. Cl.
| | | |
|---|---|---|
| H01L 27/15 | (2006.01) | |
| H01S 5/06 | (2006.01) | |
| H01S 5/028 | (2006.01) | |
| H01L 33/64 | (2010.01) | |
| H01S 5/34 | (2006.01) | |

(52) U.S. Cl.
CPC .......... H01S 5/0612 (2013.01); H01L 33/641 (2013.01); H01L 33/642 (2013.01); H01S 5/028 (2013.01); H01S 5/34 (2013.01)

(58) Field of Classification Search
CPC ...... H01L 33/641; H01L 33/642; H01L 33/48
See application file for complete search history.

(56) References Cited

U.S. PATENT DOCUMENTS

| | | | |
|---|---|---|---|
| 5,903,585 A | 5/1999 | Dawson et al. | |
| 7,875,522 B2 | 1/2011 | Kapur et al. | |
| 7,994,435 B2 * | 8/2011 | Kato | H01L 23/552 |
| | | | 174/391 |
| 9,490,318 B2 | 11/2016 | Voss et al. | |
| 2002/0054616 A1 | 5/2002 | Kamiyama et al. | |
| 2003/0080341 A1 * | 5/2003 | Sakano | H01L 33/54 |
| | | | 257/79 |
| 2010/0290217 A1 | 11/2010 | Anantram et al. | |

(Continued)

OTHER PUBLICATIONS

International Search Report and Written Opinion for PCT/US2019/036174 corresponding to U.S. Appl. No. 16/434,236, 8 pages.

(Continued)

*Primary Examiner* — Phuc T Dang
(74) *Attorney, Agent, or Firm* — John P. Wooldridge

(57) ABSTRACT

A coating having a mismatched coefficient of thermal expansion is applied to an underlying light emitting diode (LED) or laser diode (LD), such that as the temperature of the device changes, a varying level of strain is introduced to the underlying LED or LD. Because strain can also adjust the effective bandgap energy (and hence emission wavelength) of the device, the external strain-inducing coating can act to either compensate for the wavelength shift due to temperature (resulting in reduced dλ/dT) or accentuate it (resulting in increased dλ/dT). By proper selection of coating material and geometry, full control over dλ/dT can be achieved.

13 Claims, 1 Drawing Sheet

(56) References Cited

U.S. PATENT DOCUMENTS

2010/0328638 A1* 12/2010 Ishida ................ H05K 3/0061
                                                              355/67
2013/0334541 A1   12/2013 Voss et al.
2018/0219142 A1*  8/2018 Chen ................ H01L 25/0753

OTHER PUBLICATIONS

Voss et al, "Blue shift of GaAs micropillars strained with silicon nitride," Appl. Phys. Lett. 103, 212104 (2013).

* cited by examiner

STRAIN CONTROL IN OPTOELECTRONIC DEVICES

CROSS-REFERENCE TO RELATED APPLICATIONS

This application claims the benefit of U.S. Provisional Patent Application No. 62/684,720 titled "Strain Control of Temperature-Dependent Wavelength Optoelectronic Devices," filed Jun. 13, 2018, incorporated herein by reference.

STATEMENT AS TO RIGHTS TO INVENTIONS MADE UNDER FEDERALLY SPONSORED RESEARCH OR DEVELOPMENT

The United States Government has rights in this invention pursuant to Contract No. DE-AC52-07NA27344 between the United States Department of Energy and Lawrence Livermore National Security, LLC, for the operation of Lawrence Livermore National Laboratory.

BACKGROUND

Field

The present technology relates to optoelectronic devices, and more specifically, it relates to techniques for controlling the emission wavelength response to temperature of light emitting devices.

Description of Related Art

The light emission wavelength of optoelectronic devices such as light emitting diodes (LEDs) and laser diodes (LDs) is determined by both the bandgap of the emitting material system and the energy distribution of electrons and holes in that material. The band gap is a function of the crystal lattice and is known to be a function of both temperature and strain. The energy distribution of electrons and holes is dependent on material parameters (effective masses), material geometry (e.g., quantum well thickness), and temperature (Fermi-Dirac statistics). Both temperature and strain have been exploited in the past to introduce some tunability to the emission wavelength of diode lasers. For example, tunable laser diodes are produced by introducing temperature control of the laser diode. However, the rate that wavelength changes with temperature ($d\lambda/dT$) in a light emitting diode/laser diode cannot be directly engineered because of its close ties to the physical properties of the light-emitting semiconductor material.

While temperature tuning has been exploited for some applications, for many other applications it is undesired. In particular, for high power diodes that are required to operate at a specific wavelength, this introduces a significant temperature control and cooling requirements which increase complexity, cost, size and power requirements.

Strain is used in all laser diodes primarily to improve efficiency, but also as a method to shift the effective bandgap energy in order to achieve the desired emission wavelength. Strain is typically introduced during epitaxial growth and arises from lattice mismatch between layers of varying composition. This has the effect of limiting the degree of strain that can be achieved, as cracking can occur due to relaxation away from the interface. In addition, the strain is carefully controlled to improve laser efficiency.

SUMMARY

The present technology facilitates control of the emission wavelength response to temperature of light emitting devices. Light emitting diodes (LEDs) and laser diodes (LDs) exhibit an inherent wavelength shift due to temperature changes caused by the external environment and self-heating. As the temperature increases or decreases, the emission wavelength correspondingly decreases or increases due to changes in both the bandgap energy and energy distribution of electrons and holes. There are several applications where temperature insensitivity of the emission wavelength would be highly desirable, however directly engineering the wavelength-temperature coefficient ($d\lambda/dT$) of an LED or LD is difficult because it arises from the inherent physical properties of the materials used to make these devices. The present technology provides an approach that facilitates an engineered $d\lambda/dT$. This approach relies on the application of a coating having a mismatched coefficient of thermal expansion to the underlying LED/LD chip, such that as the temperature of the device changes, a varying level of strain is introduced to the underlying LED or LD. Because strain can also adjust the effective bandgap energy (and hence emission wavelength) of the device, the external strain-inducing coating can act to either compensate for the wavelength shift due to temperature (resulting in reduced $d\lambda/dT$) or accentuate it (resulting in increased $d\lambda/dT$). By proper selection of coating material and geometry, full control over $d\lambda/dT$ can be achieved.

BRIEF DESCRIPTION OF THE DRAWINGS

The accompanying drawings, which are incorporated into and form a part of the disclosure, illustrate embodiments of the technology and, together with the description, help explain the principles of the technology.

DETAILED DESCRIPTION OF THE TECHNOLOGY

Figure 2:
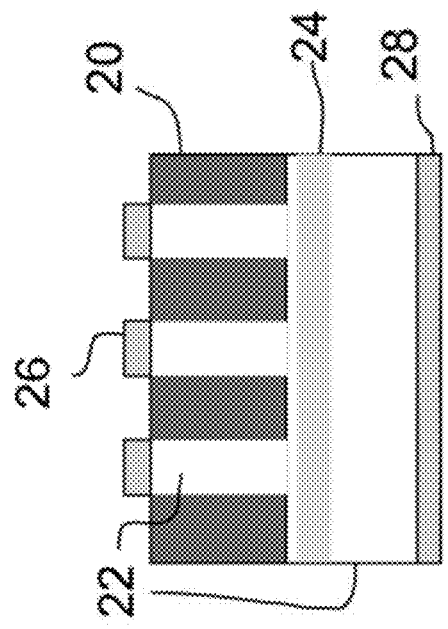
FIG. 2 shows a mismatched CTE coating between pillars of semiconductor material and further shows a quantum well located within the semiconductor material below the pillars.

The present technology takes advantage of strained microstructure technology previously developed at Lawrence Livermore National Laboratory (LLNL) as described in U.S. Pat. No. 9,490,318, incorporated herein by reference. In that patent, a description is provided where semiconductors are patterned into microstructures and are then coated with another layer, such as a dielectric. This layer is designed to have a high intrinsic strain, which is then transferred to the semiconductor. The 3D structure of the semiconductor enables high strains to be applied in a controlled manner to large volumes of semiconductors or to buried layers and has been shown to be capable of shifting the emission wavelength of semiconductor materials (Voss et al Appl. Phys. Lett. 103, 212104 (2013), incorporated herein by reference).

The present technology provides an alternative method. Instead of designing the coating for high strain, the coating layer is chosen to have a mismatched coefficient of thermal expansion with the underlying semiconductor. Thus, as a fabricated LD or LED is heated or cooled (intentionally or unintentionally), the strain can act to counteract or compliment the effect of temperature on the bandgap. This enables an additional way to control the wavelength-temperature (dλ/dT) relationship. With proper selection of geometry and CTE mismatch, LDs and LEDs with controlled dλ/dT can be produced. This leads to LDs and LEDs with believed zero temperature dependence, enhanced dependence, and even negative temperature dependence. The technology contemplates the use of materials having a negative coefficient of thermal expansion and is not limited to 3-dimensional structures. There are myriad potential applications for new LDs and LEDs in all of these regimes. These structures lend themselves well to common laser types such as vertical cavity surface emitting lasers (VCSELS) as well as edge emitting designs. Thus, the embodiments described in U.S. Pat. No. 9,490,318 can be altered according to the present technology such that rather than utilizing a strain layer, a coating layer is provided that has a mismatched coefficient of thermal expansion with the underlying semiconductor. Such embodiments are exemplary but not limiting. It is possible to provide embodiments that include the present technology as well as an intrinsic strain layer.

The tunability of laser diodes with temperature is limited, as the temperature can only be increased before the diode becomes inefficient. Thus, enhanced tunability will result in more flexible laser diodes. Zero temperature dependence significantly decreases or eliminates cooling requirements, thus reducing size, weight and power (SWaP).

The external strain approach provides a way to induce more strain than is possible through simple epitaxial growth means (i.e., the quantum wells are able to accommodate greater amounts of strain from an externally applied film than is possible with built-in strain provided by material composition adjustment). This, in turn, provides an increase in the gain of the device which helps reduce threshold and improve device efficiency.

One embodiment of the technology is a micro-structured semiconductor device such as a laser diode or light emitting diode that is coated with a second film. Exemplary materials useable for the second film include a dielectric or a metal, but other materials are possible. The second film possesses a coefficient of thermal expansion (CTE) that differs from the coefficient of thermal expansion of the semiconductor material. The microstructural geometry and second film are chosen such that the CTE mismatch results in straining of the semiconductor during heating and cooling, such that the emission wavelength of the semiconductor possesses a different behavior vs temperature than under normal conditions, .i.e., the emission wavelength of the semiconductor possesses a different behavior vs temperature different than would be exhibited by a the microstructured semiconductor device if the film having the second CTE were not fixedly attached to the semiconductor material. The entire device can be designed (semiconductor, microstructure, second film) to result in the desired dλ/dT behavior.

Figure 1:
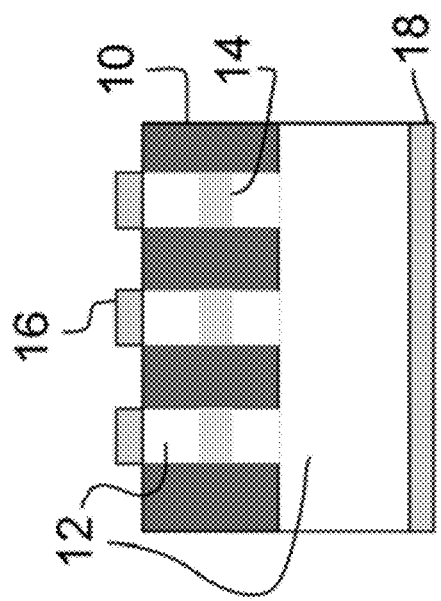
FIG. 1 shows a mismatched CTE coating between pillars of semiconductor material.
Figure 3:
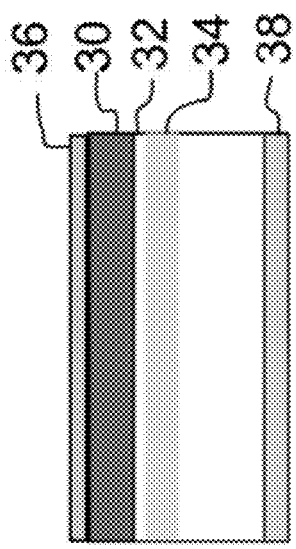
FIG. 3 shows a mismatched CTE coating above semiconductor material and further shows a quantum well located within the semiconductor material.

The schematic drawings of FIGS. 1-3 show exemplary laser diode embodiments according to the principles of the present technology. FIG. 1 shows a mismatched CTE coating 10 between pillars of semiconductor material 12. A quantum well 14 is located within the semiconductor material of each pillar. Electrodes 16 are located on top of each pillar and an electrode 18 is located on the bottom of the semiconductor material.

FIG. 2 shows a mismatched CTE coating 20 between pillars of semiconductor material 22. A quantum well 24 is located within the semiconductor material 22 below the pillars. Electrodes 26 are located on top of each pillar and an electrode 28 is located on the bottom of the semiconductor material 22.

FIG. 3 shows a mismatched CTE coating 30 above semiconductor material 32. A quantum well 34 is located within the semiconductor material 32. An electrode 36 is located on top of the a mismatched CTE coating 30 and an electrode 38 is located on the bottom of the semiconductor material 32.

Broadly, this writing discloses at least the following.

A coating having a mismatched coefficient of thermal expansion is applied to an underlying light emitting diode (LED) or laser diode (LD), such that as the temperature of the device changes, a varying level of strain is introduced to the underlying LED or LD. Because strain can also adjust the effective bandgap energy (and hence emission wavelength) of the device, the external strain-inducing coating can act to either compensate for the wavelength shift due to temperature (resulting in reduced dλ/dT) or accentuate it (resulting in increased dλ/dT). By proper selection of coating material and geometry, full control over dλ/dT can be achieved.

This writing also presents at least the following Concepts.

Concepts:

1. An apparatus, comprising:
semiconductor material having a first coefficient of thermal expansion (CTE); and
a film having a second CTE, wherein said film is fixedly attached to said semiconductor material, wherein second CTE differs from said first CTE to produce a CTE mismatch that results in straining of the semiconductor material during heating and cooling of said apparatus.

2. The apparatus of concepts 1 and 3-10, wherein said semiconductor material comprises a microstructured semiconductor device.

3. The apparatus of concepts 1, 2, 4-10, wherein said semiconductor material comprises a microstructured semiconductor device selected from the group consisting of a laser diode and a light emitting diode.

4. The apparatus of concepts 1-3 and 5-1.0, wherein said semiconductor material comprises a microstructured semiconductor device that produces an emission wavelength that depends upon temperature in a different than would be exhibited by a said microstructured semiconductor device if said film having said second CTE were not fixedly attached to said semiconductor material.

5. The apparatus of concepts 1-4 and 6-10, wherein said semiconductor material comprises a microstructured semiconductor device designed to result in a desired dλ/dT behavior.

6. The apparatus of concepts 1-5 and 7-10, wherein said film comprises a material selected from the group consisting of a dielectric and a metal.

7. The apparatus of concepts 1-6 and 8-10, wherein said semiconductor material comprises a microstructured semiconductor device, wherein said microstructured semiconductor device comprises a microstructural geometry, wherein said microstructural geometry and said film are chosen such that said CTE mismatch results in straining of said semiconductor device during heating and cooling, such that the emission wavelength of the semiconductor possesses a different behavior vs temperature than would be exhibited if said second film CTE were not fixedly attached to said semiconductor material.

8. The apparatus of concepts 1-7, 9 and 10, wherein said semiconductor material comprises a 2-dimensional semiconductor device.

9. The apparatus of concepts 1-9 and 10, wherein said semiconductor material comprises a 3-dimensional semiconductor device.

10. The apparatus of concepts 1-9, wherein said semiconductor material comprises a semiconductor device selected from the group consisting of a laser diode and a light emitting diode.

11. A method, comprising:
providing a semiconductor material having a first coefficient of thermal expansion (CTE); and
attaching a film to said semiconductor material, wherein said film comprises a second CTE, wherein second CTE differs from said first CTE to produce a CTE mismatch that results in straining of said semiconductor material during heating and cooling of at least one of said semiconductor material and said film.

12. The method of concepts 11 and 13-20, wherein said semiconductor material comprises a microstructured semiconductor device.

13. The method of concepts 11, 12 and 14-20, wherein said semiconductor material comprises a microstructured semiconductor device selected from the group consisting of a laser diode and a light emitting diode.

14. The method of concepts 1.1-13 and 15-20, wherein said semiconductor material comprises a microstructured semiconductor device that produces an emission wavelength that depends upon temperature in a different than would be exhibited by a said microstructured semiconductor device if said film having said second CTE were not fixedly attached to said semiconductor material.

15. The method of concepts 11-14 and 16-20, wherein said semiconductor material comprises a microstructured semiconductor device designed to result in a desired dλ/dT behavior.

16. The method of concepts 11-15 and 17-20, wherein said film comprises a material selected from the group consisting of a dielectric and a metal.

17. The method of concepts 11-16 and 18-20, wherein said semiconductor material comprises a microstructured semiconductor device, wherein said microstructured semiconductor device comprises a microstructural geometry, wherein said microstructural geometry and said film are chosen such that said CTE mismatch results in straining of said semiconductor device during heating and cooling, such that the emission wavelength of the semiconductor possesses a different behavior vs temperature than would be exhibited if said second film CTE were not fixedly attached to said semiconductor material.

18. The method of concepts 11-17, 19 and 20, wherein said semiconductor material comprises a 2-dimensional semiconductor device.

19. The method of concepts 11-19 and 20, wherein said semiconductor material comprises a 3-dimensional semiconductor device.

20. The method of concepts 11-19, wherein said semiconductor material comprises a semiconductor device selected from the group consisting of a laser diode and a light emitting diode.

21. An apparatus, comprising:
a substrate;
an array of three-dimensional semiconductor structures positioned above the substrate, wherein each three-dimensional structure comprises a bottom surface, a top surface and at least one side surface connecting the bottom surface and the top surface;
a cavity region between each of the three-dimensional structures; and
a film located in each cavity region and surrounding each side surface of each three-dimensional structure, the film comprising a different CTE from that of said three-dimensional semiconductor structures.

22. A method, comprising:
providing a substrate;
fixedly positioning an array of three-dimensional semiconductor structures to and above said substrate, wherein each three-dimensional structure comprises a bottom surface, a top surface and at least one side surface connecting the bottom surface and the top surface;
forming a cavity region between each of the three-dimensional structures; and
fixedly locating a film in each cavity region and surrounding each side surface of each three-dimensional structure, the film comprising a different CTE from that of said three-dimensional semiconductor structures.

All elements, parts and steps described herein are preferably included. It is to be understood that any of these elements, parts and steps may be replaced by other elements, parts and steps or deleted altogether as will be obvious to those skilled in the art.

The foregoing description of the technology has been presented for purposes of illustration and description and is not intended to be exhaustive or to limit the technology to the precise form disclosed. Many modifications and variations are possible in light of the above teaching. The embodiments disclosed were meant only to explain the principles of the technology and its practical application to thereby enable others skilled in the art to best use the technology in various embodiments and with various modifications suited to the particular use contemplated. The scope of the technology is to be defined by the following claims.

We claim:
1. An apparatus, comprising:
a substrate;
an array of three-dimensional semiconductor structures positioned above said substrate, wherein each three-dimensional semiconductor structure of said array of three-dimensional semiconductor structures comprises a first coefficient of thermal expansion (CTE), a bottom surface, a top surface and at least one side surface connecting said bottom surface and said top surface;
a cavity region between adjacent said three-dimensional semiconductor structures; and
a film located in each said cavity region and surrounding and in direct contact with each said side surface of each three-dimensional semiconductor structure of said three-dimensional semiconductor structures said film comprising second CTE that is different from that of said first CTE to produce a CTE mismatch.

2. The apparatus of claim 1, wherein said array of three-dimensional semiconductor structures comprises a microstructured semiconductor device.

3. The apparatus of claim 2, wherein said microstructured semiconductor device is selected from the group consisting of a laser diode and a light emitting diode.

4. The apparatus of claim 2, wherein said microstructured semiconductor device is configured to produce an emission wavelength that depends upon temperature in a different way than would be exhibited by a said microstructured semiconductor device if said film having said second CTE were not fixedly attached to said semiconductor material.

5. The apparatus of claim 2, wherein said microstructured semiconductor device is configured to result in a predetermined dλ/dT behavior.

6. The apparatus of claim 2, wherein said microstructured semiconductor device comprises a microstructural geometry, wherein said microstructural geometry and said film are chosen such that said CTE mismatch results in straining of said semiconductor device during heating and cooling, such that the emission wavelength of the semiconductor material of said array of three-dimensional semiconductor structures possesses a different behavior versus temperature than would be exhibited if said film having said second CTE were not fixedly attached to said semiconductor material.

7. The apparatus of claim 1, wherein said film comprises a material selected from the group consisting of a dielectric and a metal.

8. An apparatus, comprising:
a substrate;
an array of three-dimensional semiconductor structures positioned above said substrate, wherein each three-dimensional semiconductor structure of said array of three-dimensional semiconductor structures comprises a first coefficient of thermal expansion (CTE), a bottom surface, a top surface and at least one side surface connecting said bottom surface and said top surface, wherein said array of three-dimensional semiconductor structures comprises a microstructured semiconductor device;
a cavity region between adjacent said three-dimensional semiconductor structures; and
a film located in each said cavity region and surrounding each said side surface of each three-dimensional semiconductor structure of said three-dimensional semiconductor structures, said film comprising a second CTE that is different from said first CTE to produce a mismatched CTE, wherein said microstructured semiconductor device is configured to produce an emission wavelength that depends upon temperature in a different way than would be exhibited by a said microstructured semiconductor device if said film having said second CTE were not fixedly attached to said semiconductor material.

9. The apparatus of claim 8, wherein said microstructured semiconductor device is configured to result in a predetermined dλ/dT behavior.

10. The apparatus of claim 8, wherein said film comprises a material selected from the group consisting of a dielectric and a metal.

11. An apparatus, comprising:
a substrate;
an array of three-dimensional semiconductor structures positioned above said substrate, wherein each three-dimensional semiconductor structure of said array of three-dimensional semiconductor structures comprises a first coefficient of thermal expansion (CTE), a bottom surface, a top surface and at least one side surface connecting said bottom surface and said top surface, wherein said array of three-dimensional semiconductor structures comprises a microstructured semiconductor device;
a cavity region between adjacent said three-dimensional semiconductor structures; and
a film located in each cavity region and surrounding each said side surface of each said three-dimensional semiconductor structure of said three-dimensional semiconductor structures, said film comprising a second CTE that is different from said first CTE to produce a mismatched CTE, wherein said microstructured semiconductor device comprises a microstructural geometry, wherein said microstructural geometry and said film are chosen such that said mismatched CTE results in straining of said semiconductor device during heating and cooling, such that the emission wavelength of the semiconductor material of said three-dimensional semiconductor structures possesses a different behavior versus temperature than would be exhibited if said film were not fixedly attached to said semiconductor material.

12. The apparatus of claim 11, wherein said microstructured semiconductor device is configured to result in a predetermined dλ/dT behavior.

13. The apparatus of claim 11, wherein said film comprises a material selected from the group consisting of a dielectric and a metal.

* * * * *